United States Patent [19]

Ulmer et al.

[11] 4,139,880

[45] Feb. 13, 1979

[54] CMOS POLARITY REVERSAL CIRCUIT

[75] Inventors: Richard W. Ulmer, Austin, Tex.; Robert R. Beutler, Beaverton, Oreg.

[73] Assignee: Motorola, Inc., Schaumburg, Ill.

[21] Appl. No.: 838,705

[22] Filed: Oct. 3, 1977

[51] Int. Cl.² ............................................. H01L 27/00
[52] U.S. Cl. ................................... 361/246; 307/127; 307/251
[58] Field of Search ............... 361/245, 246; 307/251, 307/127, 112

[56] References Cited
U.S. PATENT DOCUMENTS 4,034,168   7/1977   Brown ................................... 361/246

OTHER PUBLICATIONS

SCP & Solid State Technology, Mar. 1966, pp. 23–29.

Primary Examiner—Gerald Goldberg
Attorney, Agent, or Firm—Joe E. Barbee

[57] ABSTRACT

Two P-channel MOS devices and two N-channel MOS devices are interconnected in a manner to provide a polarity reversal circuit. The circuit contains two input terminals and two output terminals. One of the output terminals is designated as a positive terminal while the other is designated as a negative terminal. Regardless of the polarity of voltage supplied to the input terminals, the positive voltage will always appear on the positive output terminal while the negative voltage will always appear on the negative output terminal.

8 Claims, 3 Drawing Figures

CMOS POLARITY REVERSAL CIRCUIT

BACKGROUND OF THE INVENTION

This invention relates, in general, to CMOS circuits, and more particularly, to a CMOS polarity reversal circuit.

Often it is desirable to prevent reverse power from being applied to a circuit or an electronic instrument. In order to prevent such reversal of power into a circuit, the circuit's power terminals have been arranged in a manner to make it difficult for an individual to apply power to a circuit of polarity which would be harmful to the circuit. Also, the terminals have been color coded to indicate proper polarity of the input voltage. However, these precautions do not always eliminate circuit damage which is caused through inexperience or inadvertence.

More recently, using semiconductor bipolar components, bridges have been used, especially diode bridges, to prevent damage to a circuitry caused by polarity reversals of the input voltage. The use of bipolar components in a CMOS circuit entails additional manufacturing steps and consumes a relatively considerable amount of semiconductor area since the bipolar components have to be isolated from the CMOS components. Accordingly, it will be appreciated that it would be desirable to have a CMOS circuit capable of providing an output voltage of proper polarity regardless of the polarity of the input voltage.

Accordingly, it is an object of the present invention to provide a CMOS polarity reversal circuit which provides a proper polarity output voltage regardless of the polarity of the input voltage.

Another object of the present invention is to use P-channel and N-channel MOS devices to sense polarity of an input voltage and to provide output voltage in a predetermined polarity.

Yet another object of the present invention is to provide a CMOS polarity reversal circuit which has a minimum voltage drop across the reversal circuit itself.

SUMMARY OF THE INVENTION

In carrying out the above and other objects of the invention in one form, there is provided an improved polarity reversal circuit having first and second input terminals and first and second output terminals. A first P-channel MOS device is coupled between the first input terminal and the first output terminal. A second P-channel MOS device is coupled between the second input terminal and the first output terminal. A first N-channel MOS device is coupled between the first input terminal and the second output terminal and a second N-channel MOS device is coupled between the second input terminal and the second output terminal. Regardless of the polarity of the voltage applied to the first and second input terminals the polarity of the output terminals will always be the same.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiments of the invention in one form thereof and such exemplifications are not to be construed as limiting in any manner.

DESCRIPTION OF THE PREFERRED EMBODIMENTS

Figure 1:
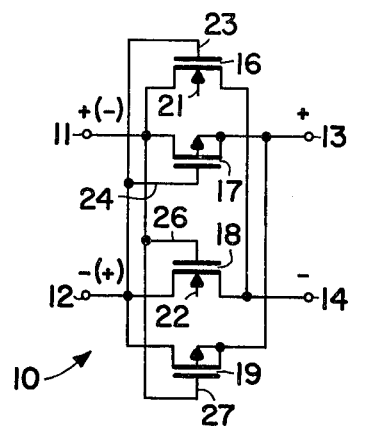
FIG. 1 is a schematic representation of an embodiment of the present invention.

FIG. 1 illustrates in schematic form a polarity reversal circuit 10 which can receive any polarity input voltage on input terminals 11 and 12 and provide a predetermined polarity output voltage at output terminals 13 and 14.

As illustrated in FIG. 1, output terminal 13 will always be of a positive polarity with respect to output terminal 14. A P-channel MOS device 17 is coupled between input terminal 11 and output terminal 13. Gate 24 of P-channel MOS device 17 is connected to input terminal 12. A N-channel MOS device 18 couples input terminal 12 to output terminal 14. Output terminal 14 is also coupled to input terminal 11 by N-channel MOS device 16. A P-channel MOS device 19 is used to couple input terminal 12 to output terminal 13. Gates 26 and 27 of MOS devices 18 and 19, respectively, are connected to input terminal 11 while gate 23 of MOS device 16 is connected to input terminal 12. P-tubs 21 and 22 of MOS devices 16 and 18, respectively, are floating to minimize any bipolar action to the substrate of the semiconductor circuit.

When the input voltage to input terminal 11 is positive with respect to the voltage applied to input terminal 12, N-channel MOS device 18 will be biased in an "on" conducting state since its gate 26 is connected to input terminal 11. When N-channel MOS device 18 is in a conducting state terminal 12 will be connected to output terminal 14. At the same time the negative voltage from input terminal 12, which is connected to gate 24 of P-channel MOS device 17, will cause MOS device 17 to conduct thereby connecting input terminal 11 to output terminal 13. Accordingly, the positive input voltage supplied to terminal 11 will appear on output terminal 13 and the negative input voltage applied to terminal 12 will appear on output terminal 14. MOS devices 16 and 19 are biased "off" or in a non-conducting state when input terminal 11 is positive and input terminal 12 is negative.

Now, if the input voltage is connected so that the negative potential is applied to input terminal 11 and the positive potential is applied to input terminal 12 then N-channel MOS device 16 will be enabled by the positive voltage being applied to its gate 23. The conduction of MOS device 16 will connect input terminal 11 to output terminal 14 and this serves to apply the negative input voltage from terminal 11 to output terminal 14. P-channel MOS device 19 will also become conductive since its gate 27 is connected to input terminal 11 which is connected to the negative input potential. The conduction of MOS device 19 will serve to connect the positive potential that is applied to terminal 12 to output terminal 13. In view of the preceding discussion, it will be appreciated that regardless of the polarity of the voltage applied to input terminals 11 and 12 of polarity reversing circuit 10, the polarity of the voltage apppearing at terminals 13 and 14 will always be the same. Circuit 10 is very useful in line operated CMOS circuits which change configuration depending upon power of polarity, i.e. NANDs become NORs, etc.

Figure 2:
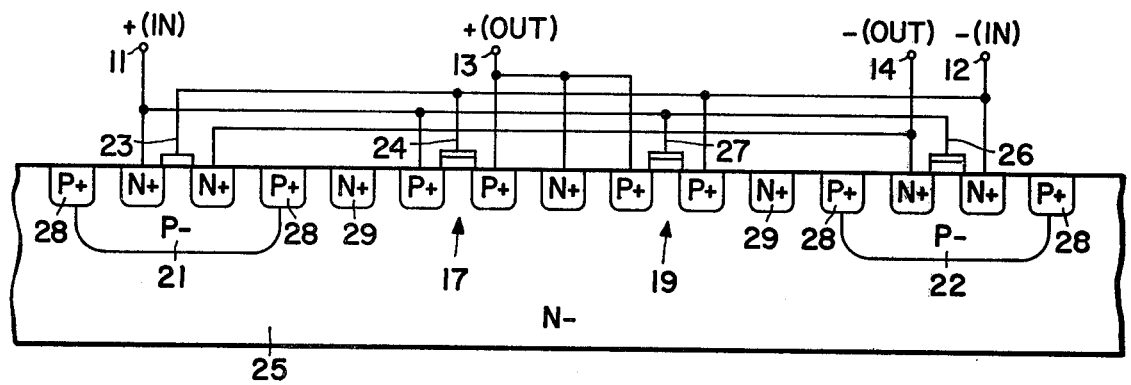
FIG. 2 illustrates an example of the semiconductor layout of the MOS devices shown in FIG. 1.

FIG. 2 illustrates a preferred semiconductor layout arrangement of the circuit of FIG. 1. When substrate material 25 is of N type silicon material, P-tubs 21 and 22 will be of P type material. Each P-tub 21, 22 has two implantations of N+ material to form the source and drain for the N-channel MOS devices 16 and 18 of FIG. 1. The source and drain N+ type material of N-channel MOS device 16 have a gate oxide layer between them to form gate 23. The source and drain of N-channel MOS device 18 have an oxide layer between them to form gate 26. P-tubs 21 and 22 have channel stops 28 which interface the P- type material of the tubs to the N type substrate and to the surface of the silicon wafer. Also, illustrated in FIG. 2 are channel stops or guard rings 29 of N+ material. It should be noted that the P-channel MOS devices do not have tubs surrounding their source and drain as do the N-channel MOS devices. The source and drains of the P-channel MOS devices 17 and 19 are formed by implantation of P+ materials which are coupled by oxide layers forming gates 24 and 27, respectively. The P-tubs of both N-channel devices are left floating and therefore any bipolar action to the substrate should not occur since the P-tub which serves as a base of the parasitic vertical NPN transistor remains unconnected. Preferably, tub 22 is spaced at least three mils or more from the P-channel device to minimize the effects of the lateral PNP parasitic transistor by making the emitter and collector of the PNP parasitic transistor further apart. The same applies to tub 21 and P-channel device 17.

Figure 3:
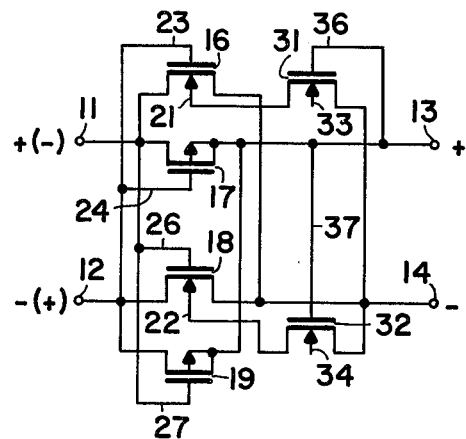
FIG. 3 illustrates in schematic form another embodiment of the present invention.

FIG. 3 is a schematic drawing of the circuit of FIG. 1 with a slight modification. The modification consists of two N-channel MOS devices 31 and 32. N-channel MOS device 31 couples the P-tub 21 of N-channel MOS device 16 to output terminal 14. N-channel MOS device 32 couples the P-tub 22 of N-channel MOS device 18 to output terminal 14 also. Both gates 36 and 37 of MOS devices 31 and 32, respectively, are connected to output terminal 13 which is the positive output terminal. Therefore, whenever a positive output voltage appears on output terminal 13 N-channel MOS devices 31 and 32 will conduct thereby connecting the P-tubs 21 and 22 to the negative output terminal 14. This takes the $V_{BE}$ voltage of the parasitic transistor to zero volts and further helps to prevent any leakage currents in N-channel MOS devices 16 or 18 whenever these devices are in the "off" condition. The rest of the circuitry of FIG. 3 is similar to FIG. 1 and operates in a similar manner.

By now it should be appreciated that there has been provided a simple and very effective CMOS polarity reversing circuit which has extremely low in-line voltage drop and essentially no leakage currents.

It is well known by those skilled in the art that MOS means metal oxide semiconductors and CMOS means complementary metal oxide semiconductors. In addition, it is well known that MOS devices are bilateral devices having two main electrodes which may interchangably function as source or drain electrodes depending on which is at the more positive voltage. The convention adopted herein is that the main electrodes are identified as either a source or a drain, although it is understood that during circuit operation an electrode identified as the source may function as a drain part of the time.

Consequently, while in accordance with the Patent Statutes, there has been described what at present are considered to be the preferred forms of the invention it will be obvious to those skilled in the art that numerous changes and modifications may be made herein without departing from the spirit and scope of the invention, and it is therefore aimed that the following claims cover all such modifications.

What is claimed as new and desired to secure by Letters Patent of the United States is:

1. A CMOS polarity reversal circuit having first and second input terminals and first and second output terminals, comprising: a first P-channel MOS device having a source, drain and gate, the source being coupled to the first input terminal, the drain being coupled to the first output terminal, the gate being coupled to the second input terminal; a first N-channel MOS device having a source, drain and gate, the source being coupled to the first input terminal, the drain being coupled to the second output terminal, the gate being coupled to the second input terminal; a second P-channel MOS device having a source, drain and gate, the source being coupled to the second input terminal, the drain being coupled to the first output terminal, the gate being coupled to the first input terminal; and a second N-channel MOS device having a source, drain and gate, the source being coupled to the second input terminal, the drain being coupled to the second output terminal, and the gate being coupled to the first input terminal, thereby forming a circuit which will always provide a desired voltage polarity at the output terminals regardless of polarity of voltage applied to the input terminals.

2. The circuit of claim 1 wherein the first and second N-channel MOS devices have floating P-tubs.

3. The circuit of claim 1 wherein P-tubs of the first and second N-channel MOS devices are coupled through MOS devices to one of the output terminals.

4. A MOS polarity reversal circuit having first and second input terminals and first and second output terminals, comprising: a first P-channel MOS device coupled between the first input terminal and the first output terminal; a second P-channel MOS device coupled between the second input terminal and the first output terminal; a first N-channel MOS device coupled between the first input terminal and the second output terminal; and a second N-channel MOS device coupled between the second input terminal and the second output terminal.

5. The polarity reversal circuit of claim 4 wherein a third MOS device is coupled between P-tub of the first N-channel MOS device and the second output terminal and a fourth MOS device is coupled between P-tub of the second N-channel MOS device and the second output terminal.

6. The polarity reversal circuit of claim 5 wherein each of the MOS devices has a gate and the gate of the first P-channel MOS device is coupled to the second input terminal, the gate of the second P-channel MOS device is coupled to the first input terminal, the gate of the first N-channel MOS device is coupled to the second input terminal, the gate of the second N-channel MOS device is coupled to the first input terminal, the gate of the third MOS device is coupled to the first output terminal, and the gate of fourth MOS device is coupled to the first output terminal.

7. The polarity reversal circuit of claim 5 wherein the third and fourth MOS devices have floating P-tubs.

8. A polarity reversal circuit, comprising at least four CMOS devices each CMOS device having a gate; a first and a second input terminal; a first and a second output terminal, the gates of the CMOS circuit being coupled to the input terminals to sense polarity of a voltage applied to the input terminals, the voltage sensed by the gates enabling predetermined two of the at least four CMOS devices to provide a desired polarity voltage at the first and second output terminals.

* * * * *